(12) United States Patent
Muraoka et al.

(10) Patent No.: US 7,948,789 B2
(45) Date of Patent: May 24, 2011

(54) RESISTANCE VARIABLE ELEMENT, NONVOLATILE SWITCHING ELEMENT, AND RESISTANCE VARIABLE MEMORY APPARATUS

(75) Inventors: Shunsaku Muraoka, Osaka (JP); Koichi Osano, Osaka (JP); Satoru Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 213 days.

(21) Appl. No.: 12/304,075

(22) PCT Filed: Mar. 27, 2008

(86) PCT No.: PCT/JP2008/000768
§ 371 (c)(1),
(2), (4) Date: Dec. 9, 2008

(87) PCT Pub. No.: WO2008/126366
PCT Pub. Date: Oct. 23, 2008

(65) Prior Publication Data
US 2010/0232204 A1    Sep. 16, 2010

(30) Foreign Application Priority Data

Apr. 9, 2007 (JP) ................................ 2007-101506

(51) Int. Cl.
*G11C 11/00* (2006.01)
(52) U.S. Cl. ..................... 365/148; 365/100; 365/104
(58) Field of Classification Search .................. 365/148, 365/100, 104
See application file for complete search history.

(56) References Cited

U.S. PATENT DOCUMENTS

| | | | |
|---|---|---|---|
| 6,204,139 B1 | 3/2001 | Liu et al. | |
| 6,815,744 B1 | 11/2004 | Beck et al. | |
| 7,087,454 B2 * | 8/2006 | Campbell et al. | 438/102 |
| 7,786,548 B2 * | 8/2010 | Osano et al. | 257/528 |
| 2008/0117664 A1 | 5/2008 | Kinoshita et al. | |
| 2008/0211011 A1 | 9/2008 | Takashima et al. | |
| 2009/0224224 A1 * | 9/2009 | Fujii et al. | 257/2 |
| 2009/0250678 A1 * | 10/2009 | Osano et al. | 257/2 |
| 2009/0283736 A1 * | 11/2009 | Kanzawa et al. | 257/2 |

FOREIGN PATENT DOCUMENTS

| | | |
|---|---|---|
| JP | 2002-537627 | 11/2002 |
| JP | 2004-363604 | 12/2004 |
| JP | 2006-202411 | 8/2006 |
| JP | 2008-205191 | 9/2008 |
| KR | 2006-0083368 | 7/2006 |
| WO | WO 00/49659 | 8/2000 |
| WO | WO 2006/077747 A1 | 7/2006 |
| WO | WO 2006/114904 | 11/2006 |
| WO | WO 2006-115208 A1 | 11/2006 |
| WO | WO 2007/013174 A1 | 2/2007 |
| WO | WO 2008/059701 A1 | 5/2008 |

* cited by examiner

*Primary Examiner* — Pho M Luu
(74) *Attorney, Agent, or Firm* — McDermott Will & Emery LLP

(57) ABSTRACT

A resistance variable element comprises a first electrode (2), a second electrode (4), and a resistance variable layer (3) which is disposed between the first electrode and the second electrode, and electrically connected to the first electrode and the second electrode, wherein the resistance variable layer comprises material including $TaO_X$ ($1.6 \leq X \leq 2.2$), an electric resistance between the first electrode and the second electrode is lowered by application of a first voltage pulse having a first voltage between the first electrode and the second electrode, and the electric resistance between the first electrode and the second electrode is increased by application of a second voltage pulse having a second voltage of the same polarity as the first voltage, between the first electrode and the second electrode.

10 Claims, 7 Drawing Sheets

RESISTANCE VARIABLE ELEMENT, NONVOLATILE SWITCHING ELEMENT, AND RESISTANCE VARIABLE MEMORY APPARATUS

RELATED APPLICATIONS

This application is the US National Phase under 35 U.S.C. §371 of International Application No. PCT/JP2008/00768 filed on Mar. 27, 2008, which claims the benefit of Japanese Application No. JP2007-101506 filed on Apr. 9, 2007, the disclosures of which Applications are incorporated by reference herein.

TECHNICAL FIELD

The present invention relates to a resistance variable element and a resistance variable memory apparatus. More particularly, the present invention relates to a resistance variable element, a nonvolatile switching element, and a resistance variable memory apparatus, whose electric resistances vary according to applied voltage pulses.

BACKGROUND ART

With the advancement of digital technologies in electronic devices, demands for an increase in a capacity of a nonvolatile resistance variable element, a reduction in writing electric power, a reduction in write/read-out time, and longer life have been increasing, for storing data such as images. In response to such demands, it is said that there is a limitation on miniaturization of an existing flash memory using a floating gate.

As a first prior art which can possibly meet the above-mentioned demands, there has been proposed a nonvolatile resistance variable element using a perovskite material (e.g., $Pr_{(1-x)}Ca_xMnO_3$ [PCMO], $LaSrMnO_3$ [LSMO], $GdBaCo_xO_Y$ [GBCO] or the like) (Patent Document 1). In this technique, a predetermined voltage pulse (a wave-shaped voltage having a short duration time) is applied to the perovskite material to increase or decrease its resistance value, and data are made to correspond to the varying resistance value to store the data.

As a second prior art which makes it possible to vary the resistance value with a unipolar voltage pulse, there has also been proposed a nonvolatile resistance variable element which utilizes that the resistance value of a film comprising transition metal oxide (NiO, $V_2O$, ZnO, $Nb_2O_5$, $TiO_2$, $WO_3$, or CoO) is varied by applying the voltage pulse to the transition metal oxide film (see Patent Document 2). For the resistance variable element using the transition metal oxide film, a configuration in which cross-point type memory arrays using diodes are formed into a layered structure is realized.

Patent Document 1: U.S. Pat. No. 6,204,139 Specification
Patent Document 2: Japanese Laid-Open Patent Application Publication No. 2004-363604

DISCLOSURE OF THE INVENTION

Problems to be Solved by the Invention

In the first prior art, however, operation stability and reproducibility are insufficient. Since an oxide crystal having a perovskite structure such as $(Pr_{0.7}Ca_{0.3}MnO_3)$ usually requires a high temperature of 650° C.~850° C. for its crystallization, other materials may be deteriorated if such a material is introduced in a semiconductor manufacturing process.

One of the measures to increase the capacity of a memory array is to form a layered structure of a plurality of memory arrays. Configuring each memory array in a cross-point structure is promising for forming the layered structure of memory arrays. In the memory array having the cross-point structure, it is necessary to prevent crosstalk (leakage current) between adjacent memory cells. Arranging a diode in series with a memory element in each memory cell is effective for preventing the crosstalk. When varying the resistance value with voltage pulses of different polarities, a current must flow in both directions, and therefore a bidirectional current restriction element (an element having a large resistance value when an absolute value of the applied voltage is smaller than a critical voltage, and having an extremely small resistance value when the absolute value of the applied voltage is equal to or higher than the critical voltage: for example, a varistor) is required. The bidirectional current restriction element is complicated in configuration. Further, even when the bidirectional current restriction element is used, there still remains a problem that the design is difficult due to a correlation with the resistance value of the resistance variable element.

In order to configure the cross-point type memory array, the memory array is desired to be writable using diodes. However, in order to utilize diodes, the memory array is desired to have a property that all the voltage pulses for writing have the same polarity (to be unipolar drivable). However, until now, only a few types of resistance variable elements having such a property have been known, and only NiO, $V_2O$, ZnO, $Nb_2O_5$, $TiO_2$, $WO_3$, CoO, and $Fe_2O_3$ have been known as materials performing unipolar operation. Therefore, development of another resistance variable element which is similarly unipolar drivable has been desired.

The present invention is made in view of the above described problems, and an object of the present invention is to provide a novel resistance variable element which can be manufactured at a low temperature, and has a property that all the voltage pulses for writing have the same polarity (unipolar drivable), and a resistance variable memory apparatus using the resistance variable element.

Means for Solving the Problems

The inventors of the present invention intensively studied the materials to be used for the resistance variable layer of the resistance variable element. As a result, it was discovered that unipolar drive can be achieved when a material comprising $TaO_X$ having an amorphous structure in which X is within a predetermined range is used for the resistance variable layer. It was also discovered that, in such configuration, the manufacturing temperature is extremely low (e.g., room temperature).

In the above-described second prior art, an operation called "forming" which applies a high voltage after manufacturing (layer formation) was required to enable the resistance variable layer to stably show a predetermined resistance value. However, if such "forming" should be performed for every element, manufacturing of a resistance variable memory apparatus having quite a lot of elements would require a long time. After studying the necessity of the "forming" in the present invention, it was discovered that the "forming" is not required for $TaO_X$ which is capable of unipolar drive.

To be specific, a resistance variable element of the present invention comprises a first electrode; a second electrode; and a resistance variable layer which is disposed between the first electrode and the second electrode, and electrically connected to the first electrode and the second electrode; wherein the resistance variable layer comprises a material including $TaO_X$ ($1.6 \leqq X \leqq 2.2$), an electric resistance between the first electrode and the second electrode is lowered by application of a first voltage pulse having a first voltage between the first electrode and the second electrode, and the electric resistance between the first electrode and the second electrode is increased by application of a second voltage pulse having a second voltage of the same polarity as the first voltage, between the first electrode and the second electrode.

In such a configuration, it is possible to provide a novel resistance variable element which can be manufactured at a low temperature, and has a property that all the voltage pulses for writing have the same polarity (unipolar drivable). Further, the "forming" may be dispensed with when manufacturing the resistance variable element.

In the above-described resistance variable element, a pulse width of the first voltage pulse may be a first pulse width, a pulse width of the second voltage pulse may be a second pulse width, and the second pulse width may be longer than the first pulse width.

In such a configuration, writing to the high-resistance state can be reliably executed.

In the above-described resistance variable element, X may be not less than 1.9 and not more than 2.2.

In such a configuration, since the variation in the resistance value due to the voltage pulse is five digits or more, favorable resistance variation characteristics can be realized.

Further, a nonvolatile switching element of the present invention comprises a first electrode; a second electrode; and a resistance variable layer which is disposed between the first electrode and the second electrode, and electrically connected to the first electrode and the second electrode; wherein the resistance variable layer comprises a material including $TaO_X$ ($1.9 \leqq X \leqq 2.2$), an electric resistance between the first electrode and the second electrode is lowered by application of a first voltage pulse having a first voltage between the first electrode and the second electrode, and the electric resistance between the first electrode and the second electrode is increased by application of a second voltage pulse having a second voltage of the same polarity as the first voltage, between the first electrode and the second electrode.

In such a configuration, since the variation in the resistance value due to the voltage pulse is five digits or more, the nonvolatile switching element can be utilized as a nonvolatile switching element having favorable switching characteristics.

The above-described resistance variable element may further comprise a rectifier element which is electrically connected to the first electrode or the second electrode. In the resistance variable element, the rectifier element may be a diode.

In such a configuration, since the rectifier element or the diode is provided, the resistance variable element can be applied to a cross-point memory.

In the above-described resistance variable element, at least one of the first electrode and the second electrode may be an electrode which comprises one or plural materials selected from a group consisting of Ag, Au, Pt, Ir, TiN, TiAlN, and Cu.

In such a configuration, a resistance variable element capable of stable operation can be provided.

In the above-described resistance variable element, the thickness of the resistance variable layer may be 200 nm or less.

In such a configuration, processing is facilitated when lithography is used in the patterning process, and thereby the voltage value of the voltage pulse which varies the resistance value of the resistance variable element can be lowered.

Further, a resistance variable memory apparatus of the present invention comprises the above-described resistance variable element, and a voltage pulse application unit, and the voltage pulse application unit may be configured to apply the first voltage pulse to the resistance variable element to change the resistance variable element into a low-resistance state, and to apply the second voltage pulse to the resistance variable element to change the resistance variable element into a high-resistance state, so as to store data in accordance with the resistance state of the resistance variable element.

In such a configuration, binary data can be stored in the resistance variable element by controlling the voltage pulse application unit.

Further, a resistance variable memory apparatus of the present invention comprises a cross-point type memory array having the above-described resistance variable element in each of memory cells; a memory cell selection unit which is configured to select a specified memory cell in the memory array; and a voltage pulse application unit, and the voltage pulse application unit is configured to apply the first voltage pulse or the second voltage pulse between the first electrode and the second electrode of the memory cell selected by the memory cell selection unit, so as to store data into the resistance variable element in accordance with a variation in the resistance value.

In such a configuration, a cross-point type memory array is realized, and thereby forming a layered structure of memory arrays is facilitated to improve an integration degree.

Further, a resistance variable memory apparatus of the present invention comprises a semiconductor substrate; a memory array including a plurality of first wires formed to extend in parallel with each other on the semiconductor substrate; a plurality of second wires formed to extend in parallel with each other and to three-dimensionally cross the plurality of first wires; and memory elements each having the above-described resistance variable element and a rectifier element which are connected in series and being disposed at respective three-dimensional cross points of the plurality of first wires and the plurality of second wires, the memory elements being two-dimensionally arranged; a first wire selection unit which is configured to select a specified one of the first wires; a second wire selection unit which is configured to select a specified one of the second wires; and a voltage pulse application unit, and the voltage pulse application unit is configured to apply the first voltage pulse between the first electrode and the second electrode of the memory cell which is connected to the first wire selected by the first wire selection unit and to the second wire selected by the second wire selection unit to change the resistance variable element into a low-resistance state, and to apply the second voltage pulse between the first electrode and the second electrode of the memory cell which is connected to the first wire selected by the first wire selection unit and to the second wire selected by the second wire selection unit to change the resistance variable element into a high-resistance state, so as to store data in accordance with the resistance state of the resistance variable element.

In such a configuration, a binary-data storage type cross-point type memory array is realized, and thereby forming a layered structure of memory arrays is facilitated to improve an integration degree.

Foregoing object, other object, features, and advantages of the present invention will be apparent from the following detailed description of the preferred embodiments with reference to accompanying drawings.

Effects of the Invention

Since the present invention is configured as described above, it is possible to provide a novel resistance variable element which can be manufactured at a low temperature, and has a property that all the voltage pulses for writing have the same polarity (unipolar drivable), and a resistance variable memory apparatus using the resistive variable element.

EXPLANATION OF REFERENCE NUMERALS

Figure 1:
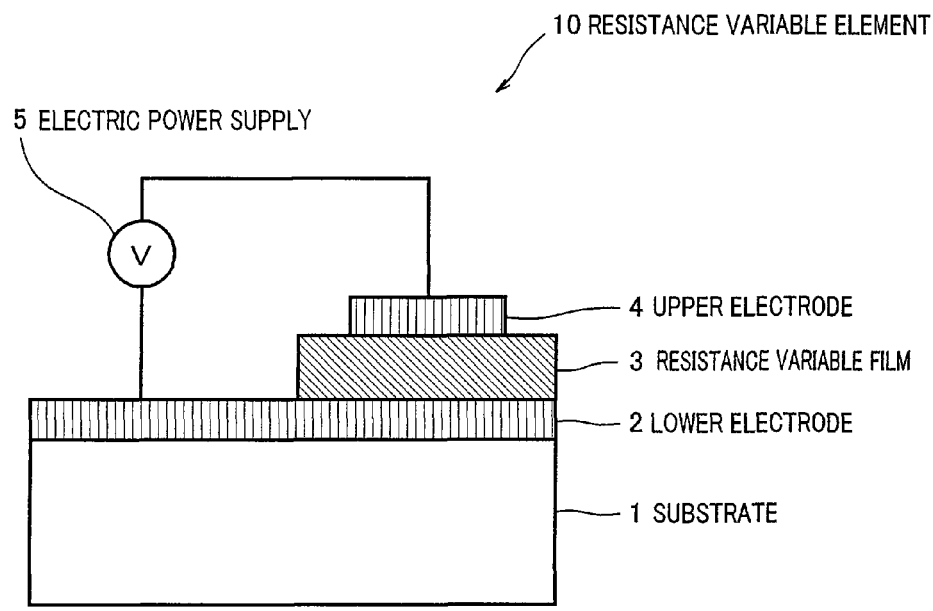
FIG. 1 is a schematic view illustrating an example of a configuration of a resistance variable element according to Embodiment 1 of the present invention.

1 . . . substrate
2 . . . lower electrode
3 . . . resistance variable layer
4 . . . upper electrode
5 . . . electrode
6 . . . resistance variable element
7 . . . rectifier element
10 . . . resistance variable element
11 . . . first terminal
12 . . . second terminal
100 . . . resistance variable memory apparatus
101 . . . memory array
102 . . . address buffer
103 . . . controller
104 . . . row decoder
105 . . . word line driver
106 . . . column decoder
107 . . . bit line driver
W1,W2,W3 . . . word line
B1,B2,B3 . . . bit line
MC11,MC12,MC13,MC21,MC22,MC23,MC31,MC32, MC33 . . . memory cell

BEST MODE FOR CARRYING OUT THE INVENTION

Hereinafter, the embodiments of the present invention will be described in detail with reference to the Figures. Throughout the drawings, the same or corresponding components are identified by the same reference numerals, and the descriptions thereof are omitted in some cases.

Embodiment 1

Configuration

FIG. 1 is a schematic view illustrating an example of a configuration of a resistance variable element according to Embodiment 1 of the present invention. As shown in FIG. 1, a resistance variable element 10 of this embodiment comprises a substrate 1, a lower electrode 2 (first electrode) formed on the substrate 1, a resistance variable layer 3 formed on the lower electrode 2, and an upper electrode 4 (second electrode) formed on the resistance variable layer 3. The lower electrode 2 and the upper electrode 4 are respectively electrically connected to the resistance variable layer 3. The upper electrode 4 may be the first electrode, while the lower electrode 2 may be the second electrode.

The substrate 1 is formed of, for example, a silicon substrate.

The lower electrode 2 and the upper electrode 4 may be made of one or plural materials selected from a group consisting of, for example, Ag (silver), Au (gold), Pt (platinum), Ir (iridium), TiN (titanium nitride), TiAlN (titanium aluminum nitride), and Cu (copper).

The resistance variable layer 3 is preferably made of a material which is expressed by a chemical formula of $TaO_X$ and has an amorphous structure. It suffices that the resistance variable layer includes a material which is expressed by a chemical formula of $TaO_X$ and has an amorphous structure. Further, $TaO_X$ is not necessarily of an amorphous structure, and may include a plurality of fine crystals. A peak of X-ray diffraction of the resistance variable layer 3 was broadened in an example. Although such a broad peak basically indicates that the resistance variable layer 3 includes a material having an amorphous structure, there are some cases where such a broad peak appears also when the resistance variable layer 3 includes plural file crystals. That is, in this embodiment, the specific configuration of the resistance variable layer 3 may be such that the resistance variable layer 3 includes either the amorphous structure or the plural fine crystals.

More preferably, the value of X (the ratio of O) is not less than 1.6 and not more than 2.2. In such a configuration, unipolar drive is realized, and the "forming" is dispensed with.

The thickness of the resistance variable layer 3 is preferably equal to or less than 1 μm. In such a configuration, it becomes sufficiently possible to vary the resistance value of the resistance variable element by applying voltage pulses.

More preferably, the thickness of the resistance variable layer 3 is equal to or less than 200 nm. In such a configuration, processing is facilitated when lithography is used in the patterning process, and the voltage value of the voltage pulse which varies the resistance value of the resistance variable element can be reduced.

The thickness of the resistance variable layer 3 is preferably at least 5 nm or more. In such a configuration, breakdown (insulation breakdown) at the time of voltage application can be avoided more reliably.

It can be said that the above described preferable numerical ranges relating to the thickness of the resistance variable layer 3 are fundamentally common-sense values in the conventional resistance variable element.

The thickness of the resistance variable layer 3 is preferably as thin as possible from the viewpoint of reducing the voltage value of the voltage pulse which varies the resistance value of the resistance variable element.

[Manufacturing Method]

Initially, the lower electrode 2 (about 0.2 μm thick) is formed on the substrate 1 by sputtering or the like. Next, a target of Ta is prepared, oxygen is mixed into argon with a predetermined flow rate ratio, and reactive sputtering is performed, thereby forming on the lower electrode 2 the resistance variable layer 3 which is expressed by a chemical formula of $TaO_X$ and has an amorphous structure. Further, the upper electrode 4 (about 0.2 μm thick) is formed on the resistance variable layer 3 by sputtering or the like to obtain the resistance variable element 10.

The sizes and shapes of the lower electrode 2, the upper electrode 4, and the resistance variable layer 3 are adjustable using a mask and lithography.

The value of X of the resistance variable layer 3 can be easily adjusted based on the ratio of the oxygen gas flow rate to the argon gas flow rate. The substrate temperature may be set to the room temperature without particularly heating the substrate.

[Operation]

As shown in FIG. 1, when the resistance variable element 10 is used, the lower electrode 2 and the upper electrode 4 are electrically connected to different terminals of an electric power supply 5 (voltage pulse applying device), respectively. The electric power supply 5 is an electric power supply used for driving the resistance variable element 10. The electric power supply 5 is configured to apply an electric pulse (voltage pulse) having predetermined voltage and time width between the lower electrode 2 and the upper electrode 4. Hereinafter, it is assumed that the voltage of the voltage pulse is specified by the electric potential of the upper electrode 4 based on the lower electrode 2.

When the electric pulse is applied by the electric power supply 5, the resistance value (electric resistance) of the resistance variable layer 3 increases or decreases. Hereinafter, the case where the resistance value of the resistance variable layer 3 is a predetermined high value is referred to as that the resistance variable element 10 is in a high-resistance state, while the case where the resistance value of the resistance variable layer 3 is a predetermined value lower than that in the high-resistance state is referred to as that the resistance variable element 10 is in a low-resistance state.

For example, when a voltage pulse having a first voltage and a first pulse width (first voltage pulse: short pulse) is applied to the resistance variable element 10 in the high-resistance state, the resistance variable element 10 changes to the low-resistance state. Even when a short pulse of the same polarity as the first voltage pulse is applied to the resistance variable element 10 in the low-resistance state, the resistance variable element 10 does not change but remains in the low-resistance state.

On the other hand, when a voltage pulse having a second voltage that is lower than the first voltage and a second pulse width that is longer than the first pulse width (second voltage pulse: long pulse) is applied to the resistance variable element 10 in the low-resistance state, the resistance variable element 10 changes to the high-resistance state. Even when a long pulse of the same polarity as the second voltage pulse is applied to the resistance variable element 10 in the high-resistance state, the resistance variable element 10 does not change but remains in the high-resistance state.

In this embodiment, the long pulse may have the same voltage polarity as that of the short pulse (for example, both may be positive voltage pulses). That is, the resistance variable element of this embodiment can be used for unipolar drive. In the resistance variable element 10 of this embodiment, for example, the first voltage may be +4.0V, the first pulse width may be 100 ns, the second voltage may be +2.0V, and the second pulse width may be 10 μs.

In this embodiment, it is assumed that the high-resistance state corresponds to "0," the low-resistance state corresponds to "1," and the initial state of the resistance variable element 10 is the high-resistance state ("0"). Which value is assigned to which resistance state, and which resistance state is regarded as the initial state, are determined as desired.

Figure 2:
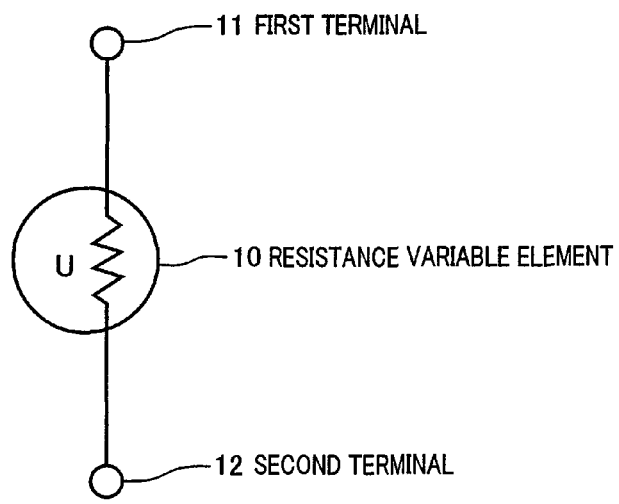
FIG. 2 is a view illustrating an example of a circuit for operating the resistance variable element according to Embodiment 1 of the present invention.

FIG. 2 is a view illustrating an example of a circuit for operating the resistance variable element according to Embodiment 1 of the present invention. It is assumed that the resistance variable element 10 is used as a memory to perform processing (writing and reading out) for 1-bit data. The circuit shown in FIG. 2 includes the resistance variable element 10, a first terminal 11, and a second terminal 12. The upper electrode 4 and the lower electrode 2 of the resistance variable element 10 are electrically connected to the first terminal 11 and the second terminal 12, respectively.

Figure 3:
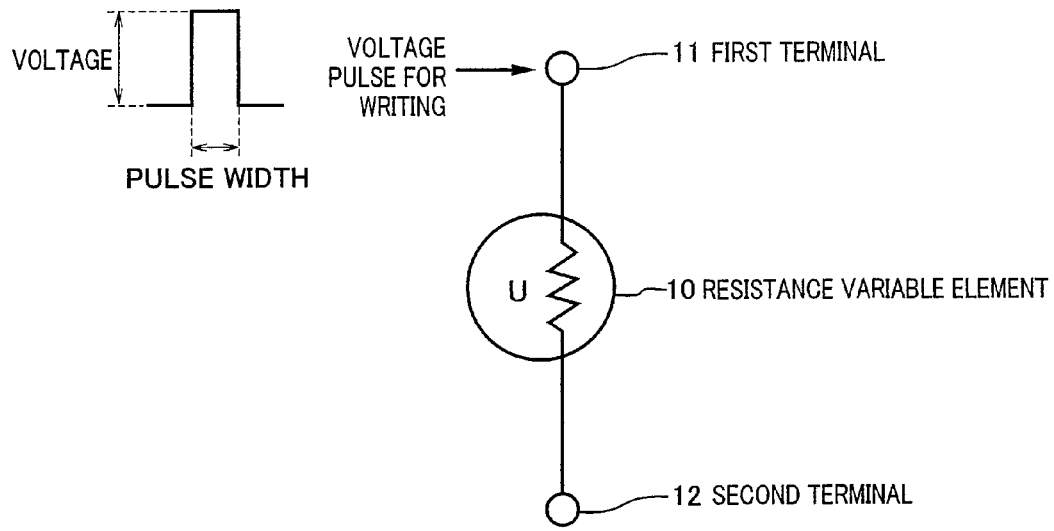
FIG. 3 is a view illustrating the operation for writing data in the resistance variable element according to Embodiment 1 of the present invention.
Figure 4:
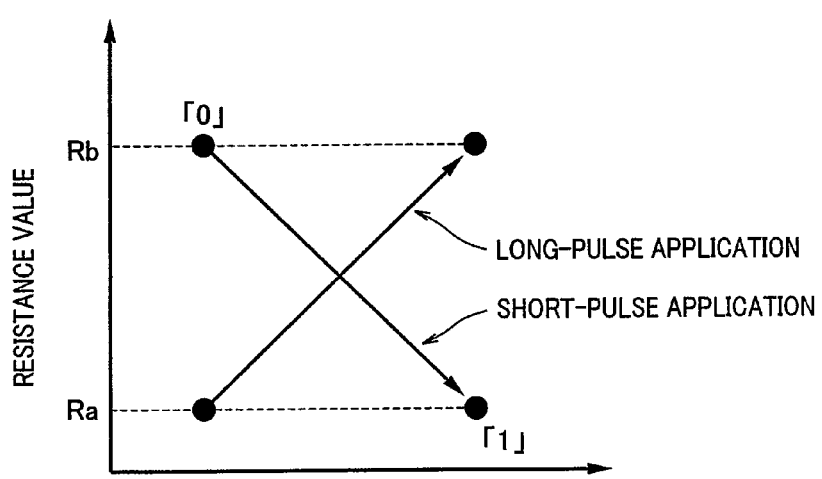
FIG. 4 is a view illustrating variations in a resistance value occurring when writing data in the resistance variable element according to Embodiment 1 of the present invention.

FIG. 3 is a view illustrating the operation in the case where data are written in the resistance variable element according to Embodiment 1 of the present invention. FIG. 4 is a view illustrating variations in the resistance value occurring when data are written in the resistance variable element according to Embodiment 1 of the present invention. As shown in FIG. 3, at the time of writing, the second terminal 12 is grounded (GND), and a voltage pulse is applied to the first terminal 11. The voltage pulse is specified based on the lower electrode 2 and a ground point.

When the short pulse is applied to the first terminal 11, the resistance value of the resistance variable element 10 decreases from Rb of the high-resistance state to Ra of the low-resistance state as shown in FIG. 4. On the other hand, when the long pulse is applied to the first terminal 11, the resistance value of the resistance variable element 10 increases from Ra of the low-resistance state to Rb of the high-resistance state as shown in FIG. 4.

When 1-bit data indicating "1" is written (stored) in the resistance variable element 10, the resistance variable element 10 changes to the low-resistance state (including the case where it is originally in the low-resistance state and does not change). This operation is referred to as "writing to the low-resistance state." During the writing to the low-resistance state, the second terminal 12 shown in FIG. 3 is grounded, and the short pulse for writing is applied to the first terminal 11.

According to this operation, the short pulse is applied to the resistance variable element 10, so that the resistance value of the resistance variable element 10 becomes Ra of the low-resistance state. That is, when the resistance value before the voltage pulse application is Rb, it varies to Ra, while when the resistance value before the voltage pulse application is Ra, it does not vary but remains at Ra. According to the above described method, writing to the low-resistance state of the resistance variable element 10 is performed.

When 1-bit data indicating "0" is written (stored) in the resistance variable element 10, the resistance variable element 10 changes to the high-resistance state (including the case where it is originally in the high-resistance state and does not change). This operation is referred to as "writing to the high-resistance state." During the writing to the high-resistance state, the second terminal 12 shown in FIG. 3 is grounded, and the long pulse for writing is applied to the first terminal 11. According to this operation, the long pulse is applied to the resistance variable element 10, and the resistance value of the resistance variable element 10 becomes Rb of the high-resistance state. That is, when the resistance value before the voltage pulse application is Rb, it does not vary but remains at Rb, while when the resistance value before the voltage pulse application is Ra, it varies to Rb. According to the above described method, writing to the high-resistance state of the resistance variable element 10 is performed.

Figure 5:
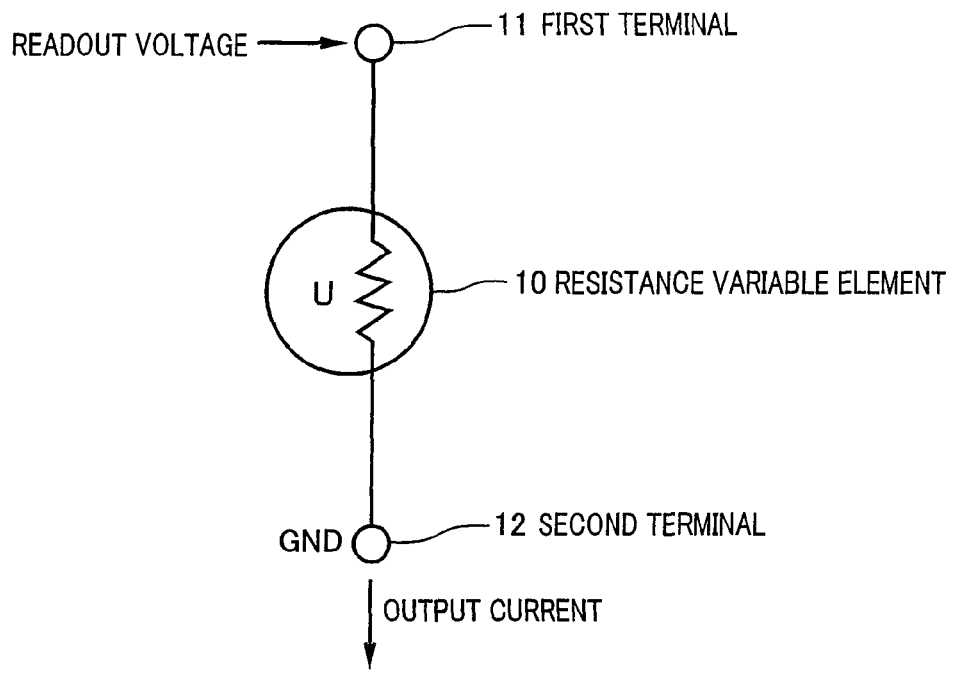
FIG. 5 is a view illustrating the operation for reading out the data written in the resistance variable element according to Embodiment 1 of the present invention.
Figure 6:
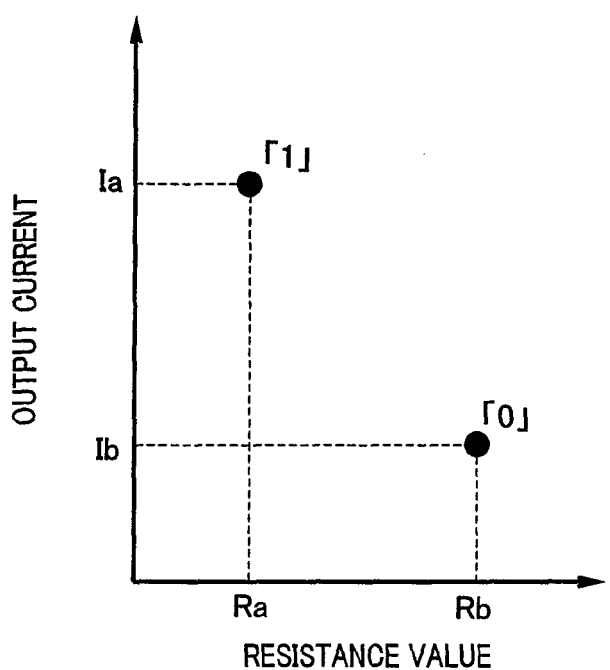
FIG. 6 is a view illustrating the relationship between a current that flows in a circuit and the resistance value of the resistance variable element during read-out, in the resistance variable element according to Embodiment 1 of the present invention.

FIG. 5 is a view illustrating the operation in the case where data written in the resistance variable element according to Embodiment 1 of the present invention are read out. FIG. 6 is a view illustrating the relationship between the current that flows in the circuit and the resistance value of the resistance variable element, during the read-out, in the resistance variable element according to Embodiment 1 of the present invention. As shown in FIG. 5, during writing, the second terminal 12 is grounded (GND), and a readout voltage is applied to the first terminal 11. The readout voltage is specified based on the lower electrode 2 and the ground point.

When the readout voltage is applied to the first terminal 11, a current according to the resistance value of the resistance variable element 10 flows through the circuit. That is, as shown in FIG. 6, the output current value is Ia when the resistance value of the resistance variable element 10 is Ra of the low-resistance state, while it is Ib when the resistance value of the resistance variable element 10 is Rb of the high-resistance state.

When reading out the resistance state of the resistance variable element 10, the second terminal 12 shown in FIG. 5 is grounded, and the readout voltage is applied to the first terminal 11. The readout voltage is set to, for example, +0.5V. When the readout voltage is applied to the resistance variable element 10, the magnitude of the current that flows in the circuit becomes a current value according to the resistance value of the resistance variable element. The resistance value of the resistance variable element 10 is obtained by detecting the current value of the current that flows between the first terminal 11 and the second terminal 12. That is, when the current value is Ia, it is found that the data written in the resistance variable element 10 is "1," since the resistance value of the resistance variable element 10 is Ra of the low-resistance state. When the current value is Ib, it is found that the data written in the resistance variable element 10 is "0," since the resistance value of the resistance variable element 10 is Rb of the high-resistance state. According to the above described method, reading out of the data written in the resistance variable element 10 is performed.

The resistance variable element 10 of this embodiment has non-volatility which does not vary the resistance value even when the electric power supply is turned off.

[Effects]

The resistance variable element of this embodiment is characterized by that all the voltage pulses for writing have the same polarity (it is unipolar drivable). When it is unipolar drivable, a cross-point type memory array using unidirectional diodes can be configured, thereby facilitating forming a layered structure to improve an integration degree.

Since the resistance variable element of this embodiment can be manufactured under the room temperature, it has high affinity with the conventional semiconductor manufacturing process (400° C. or lower).

Further, in the resistance variable element of this embodiment, the "forming" is dispensed with, resulting in a significant reduction in the manufacturing time.

[Modification]

The first voltage, the first pulse width, the second voltage, the second pulse width, and the readout voltage are not limited to the above described values. Any values may be adopted so long as they are adaptable to the resistance variable element which is actually manufactured.

Other layers may be sandwiched between the lower electrode 2 and the resistance variable layer 3 and between the resistance variable layer 3 and the upper electrode 4 so long as the lower electrode 2 and the resistance variable layer 3 are electrically connected and the resistance variable layer 3 and the upper electrode 4 are electrically connected.

In the above description, the reactive sputtering using the target material of Ta is performed, and the ratio of the oxygen gas flow rate to the argon gas flow rate during the sputtering is adjusted to vary the value of X in the chemical formula of $TaO_X$. However, the method for adjusting the components of the resistance variable layer is not limited thereto. For example, the value of X in the chemical formula of $TaO_X$ can be varied by performing sputtering using a target which is obtained by mixing Ta and $Ta_2O_5$ in a predetermined ratio.

EXAMPLES

Example 1

A lower electrode (size: 20 μm×20 μm) comprising Pt was formed to have a thickness of 0.2 μm on a silicon substrate by sputtering. Next, a target of Ta was prepared, oxygen was mixed into argon with a predetermined flow rate ratio, and reactive sputtering was performed, thereby forming on the lower electrode 2 the resistance variable layer 3 which is expressed by a chemical formula of $TaO_X$ and has an amorphous structure. Then, using a mask and lithography, the resistance variable layer (size: 10 μm×10 μm, area: 100 μm²) which is expressed by a chemical formula of $TaO_X$ and has an amorphous structure was formed on the lower electrode. The resistance variable layer was formed under the room temperature without particularly heating the substrate. The size of the portion where the lower electrode contacts the resistance variable layer was 10 μm×10 μm (area: 100 μm²). The thickness of the resistance variable layer was 100 nm. Further, an upper electrode (size: 2 μm×2 μm) comprising Pt was formed to have a thickness of 0.2 μm on the resistance variable layer by sputtering using a mask and lithography. Thus, a resistance variable element was obtained. The size of the portion where the upper electrode contacts the resistance variable layer was 2 μm×2 μm (area: 4 μm²).

In Example 1, the flow rate ratio of the oxygen gas during the reactive sputtering was controlled so that the value of X in TaO$_X$ which forms the resistance variable layer became 1.6. The value of X was verified by a RBS (Rutherford back scattering) method. As a result of the verification, the value of X was 1.6.

The resistance variable element obtained by the above described method was connected to an electric power supply, and a short pulse (voltage: +4.0V, pulse width: 100 ns) and a long pulse (voltage: +2.0V, pulse width: 10 µs) were alternately applied. A voltage with which the electric potential of the upper electrode became higher than that of the lower electrode was a plus voltage.

The resistance value of the resistance variable element was measured every time the voltage pulse was applied. During the measurement, a voltage of +0.5V was applied for about 100 ns. The resistance value of the resistance variable element did not vary with such a degree of voltage. The resistance value of the resistance variable element was calculated from the applied voltage (+0.5V) and the flowing current.

It was confirmed that the resistance variable element of this example has nonvolatility by which the resistance value does not vary even when the electric power supply is turned off.

Figure 7:
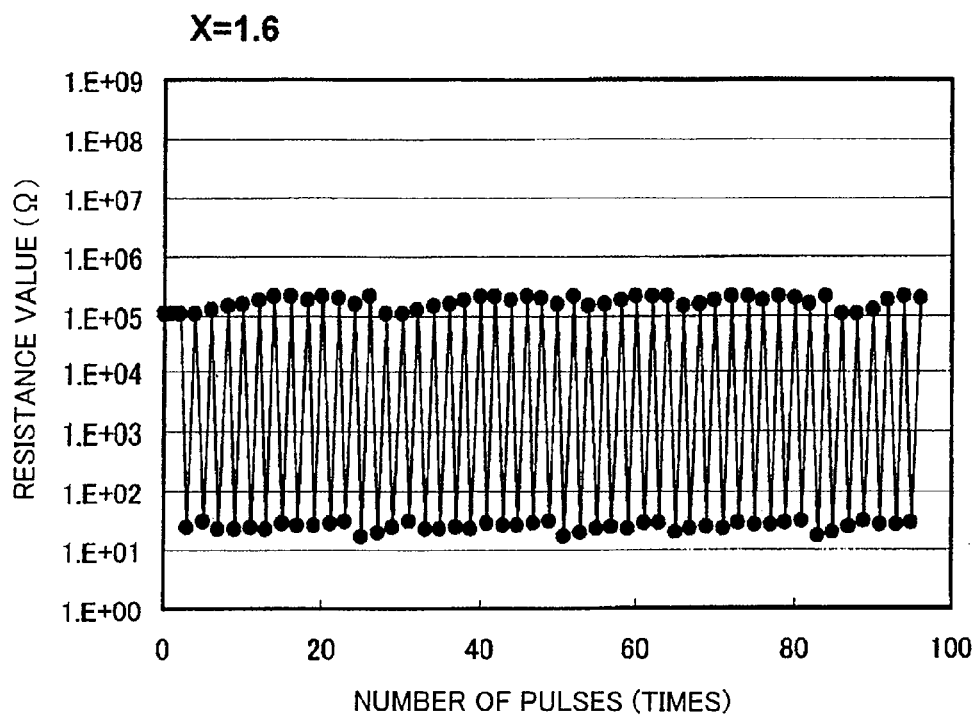
FIG. 7 is a view illustrating variations in the resistance value occurring when a voltage pulse is applied to a resistance variable element according to Example 1 of the present invention.

FIG. 7 is a view illustrating variations in the resistance value occurring when the voltage pulse is applied to the resistance variable element of Example 1. In FIG. 7, the resistance value does not vary at the plots of the first three pulses (number of pulses=0, 1, 2). This is because the data obtained by measuring the initial resistance value three times are plotted, and actually no pulse is applied. As shown in FIG. 7, the resistance value significantly varied from the high-resistance state (about 150 kΩ) to the low-resistance state (about 30Ω) by the first-time pulse application (application of the short pulse) (the plot at which the number of pluses is 3). The resistance variable element restored from the low-resistance state to the high-resistance state by the second-time pulse application (application of the long pulse) (the plot at which the number of pulses is 4). Thereafter, the resistance variable element periodically transitioned between the low-resistance state and the high-resistance state with stability by the applications of the two types of voltage pulses (the short pulse and the long pulse). That is, the resistance variable element obtained in Example 1 had favorable memory characteristics from the first-time pulse application. Accordingly, it was found that the resistance variable element of Example 1 does not require the "forming," and the resistance variable element obtained by forming the respective layers can be used as it is, as a memory.

Even when the short pulse was applied to the resistance variable element of Example 1 in the low-resistance state, the resistance value did not substantially vary but remained in the low-resistance state. On the other hand, even when the long pulse was applied to the resistance variable element in the high-resistance state, the resistance value did not substantially vary but remained in the high-resistance state. From the above result, it was found that the resistance variable element of Example 1 is overwritable.

Example 2

In Example 2, a resistance variable element was manufactured and writing and reading out were carried out in manners similar to those in Example 1 except that different parameters were used.

To be specific, in Example 2, the flow rate ratio of the oxygen gas during the reactive sputtering was controlled so that the value of X in TaO$_X$ which forms the resistance variable layer became 1.9. The value of X was verified by the RBS (Rutherford back scattering) method. As a result of the verification, the value of X was 1.9.

The resistance variable element obtained by the above described method was connected to an electric power supply, and a short pulse (voltage: +5.0V, pulse width: 100 ns) and a long pulse (voltage: +2.5V, pulse width: 100 µs) were alternately applied. A voltage with which the electric potential of the upper electrode became higher than that of the lower electrode was a plus voltage.

The resistance value of the resistance variable element was measured every time the voltage pulse was applied. During the measurement, a voltage of +0.5V was applied for about 100 ns. The resistance value of the resistance variable element did not vary with such a degree of voltage. The resistance value of the resistance variable element was calculated from the applied voltage (+0.5V) and the flowing current.

It was confirmed that the resistance variable element of this example has nonvolatility by which the resistance value does not vary even when the electric power supply is turned off.

Figure 8:
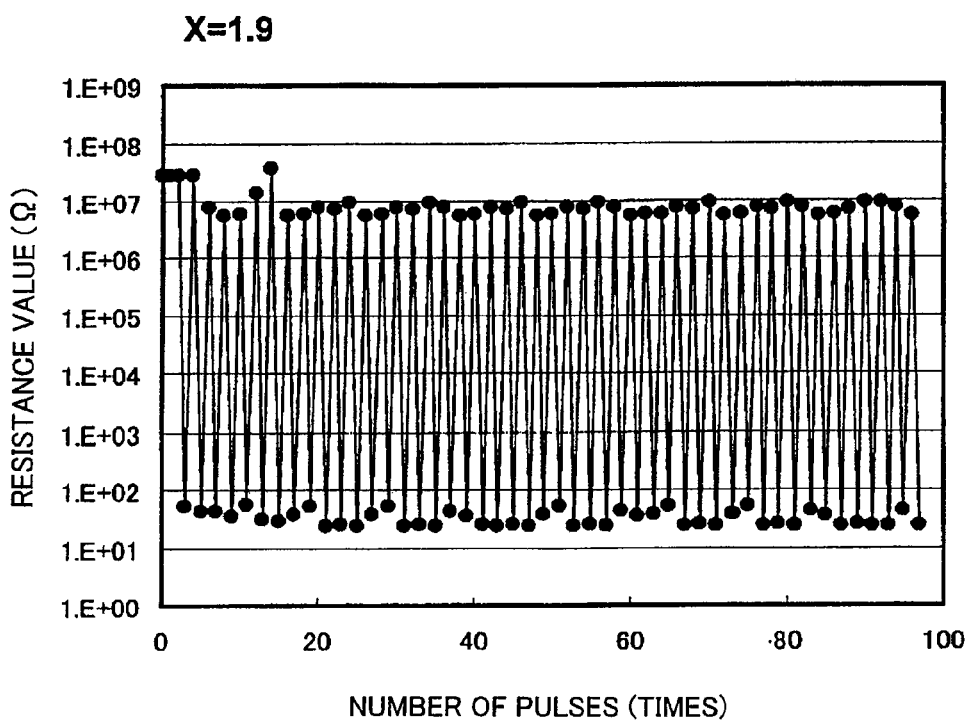
FIG. 8 is a view illustrating variations in the resistance value occurring when a voltage pulse is applied to a resistance variable element according to Example 2 of the present invention.

FIG. 8 is a view illustrating variations in the resistance value occurring when the voltage pulse is applied to the resistance variable element of Example 2. In FIG. 8, the resistance value does not vary at the plots of the first three pulses (number of pulses=0, 1, 2). This is because the data obtained by measuring the initial resistance value three times are plotted, and actually no pulse is applied. As shown in FIG. 8, the resistance value varied from the high-resistance state (about 10 MΩ) to the low-resistance state (about 30Ω) by the first-time pulse application (application of the short pulse) (the plot at which the number of pluses is 3). The resistance variable element restored from the low-resistance state to the high-resistance state by the second-time pulse application (application of the long pulse) (the plot at which the number of pulses is 4). Thereafter, the resistance variable element periodically transitioned between the low-resistance state and the high-resistance state with stability by the applications of the two types of voltage pulses (the short pulse and the long pulse). That is, the resistance variable element obtained in Example 2 had favorable memory characteristics from the first-time pulse application. Accordingly, it was found that the resistance variable element of Example 2 does not require the "forming," and the resistance variable element obtained by forming the respective layers can be used as it is, as a memory.

Even when the short pulse was applied to the resistance variable element of Example 2 in the low-resistance state, the resistance value did not substantially vary but the element remained in the low-resistance state. On the other hand, even when the long pulse was applied to the resistance variable element in the high-resistance state, the resistance value did not substantially vary but the element remained in the high-resistance state. From the above result, it was found that the resistance variable element of Example 2 is overwritable.

Example 3

In Example 3, a resistance variable element was manufactured and writing and reading out were carried out in similar manners to those in Example 1 except that different parameters were used.

To be specific, in Example 3, the flow rate ratio of the oxygen gas during the reactive sputtering was controlled so that the value of X in TaO$_X$ which forms the resistance variable layer became 2.2. The value of X was verified by the RBS (Rutherford back scattering) method. As a result of the verification, the value of X was 2.2.

The resistance variable element obtained by the above described method was connected to an electric power supply, and a short pulse (voltage: +5.5V, pulse width: 100 ns) and a long pulse (voltage: +3.0V, pulse width: 1 ms) were alternately applied. A voltage with which the electric potential of the upper electrode became higher than that of the lower electrode was a plus voltage.

The resistance value of the resistance variable element was measured every time the voltage pulse was applied. During the measurement, a voltage of +0.5V was applied for about 100 ns. The resistance value of the resistance variable element did not vary with such a degree of voltage. The resistance value of the resistance variable element was calculated from the applied voltage (+0.5V) and the flowing current.

It was confirmed that the resistance variable element of this example has nonvolatility by which the resistance value does not vary even when the electric power supply is turned off.

Figure 9:
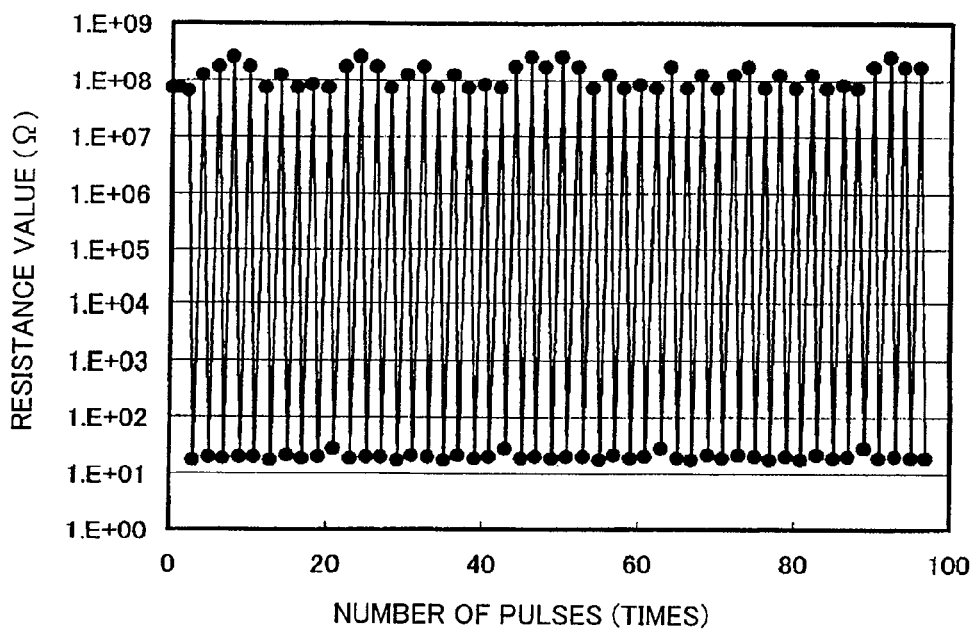
FIG. 9 is a view illustrating variations in the resistance value occurring when a voltage pulse is applied to a resistance variable element according to Example 3 of the present invention.

FIG. 9 is a view illustrating variations in the resistance value occurring when the voltage pulse is applied to the resistance variable element of Example 3. In FIG. 9, the resistance value does not vary at the plots of the first three pulses (number of pulses=0, 1, 2). This is because the data obtained by measuring the initial resistance value three times are plotted, and actually no pulse is applied. As shown in FIG. 9, the resistance value varied from the high-resistance state (about 100 MΩ) to the low-resistance state (about 20Ω) by the first-time pulse application (application of the short pulse) (the plot at which the number of pluses is 3). The resistance variable element restored from the low-resistance state to the high-resistance state by the second-time pulse application (application of the long pulse) (the plot at which the number of pulses is 4). Thereafter, the resistance variable element periodically transitioned between the low-resistance state and the high-resistance state with stability by the applications of the two types of voltage pulses (the short pulse and the long pulse). That is, the resistance variable element obtained in Example 3 had favorable memory characteristics from the first-time pulse application. Accordingly, it was found that the resistance variable element of the Example 3 does not require the "forming," and the resistance variable element obtained by forming the respective layers can be used as it is, as a memory.

Even when the short pulse was applied to the resistance variable element of the Example 3 in the low-resistance state, the resistance value did not substantially vary but the element remained in the low-resistance state. On the other hand, even when the long pulse was applied to the resistance variable element in the high-resistance state, the resistance value did not substantially vary but the element remained in the high-resistance state. From the above result, it was found that the resistance variable element of Example 3 is overwritable.

Example 4

In Example 4, endurance characteristics (operation stability) were verified using the resistance variable element having X=2.2 which is obtained in Example 3.

Figure 10:
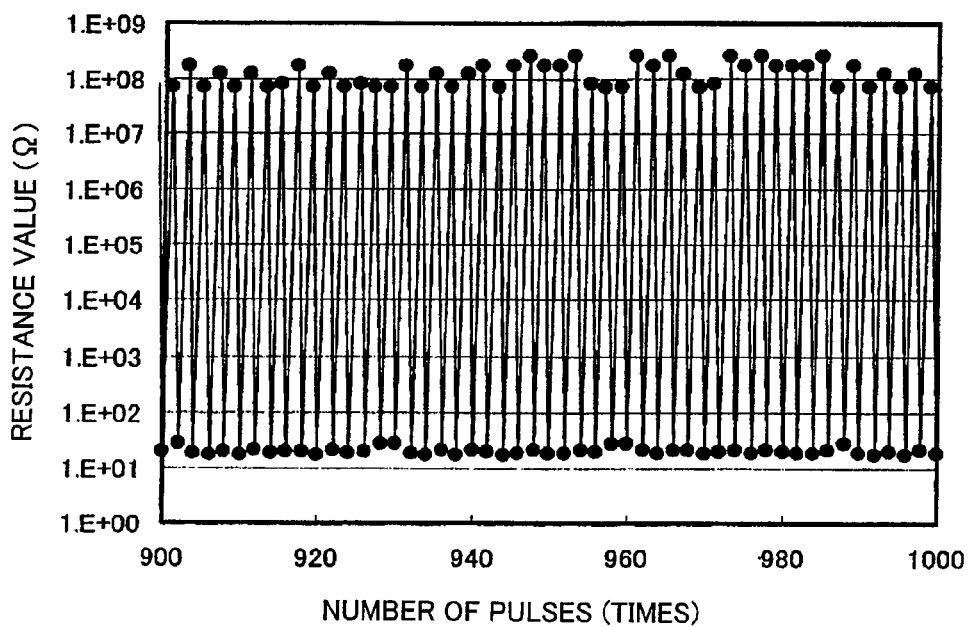
FIG. 10 is a view illustrating variations in the resistance value occurring when about 1000 times of write operation to the low-resistance state (voltage pulse: +5.5V, 100 ns) and write operation to the high-resistance state (voltage pulse: +3.0V, 1 ms) are repeatedly performed with respect to the resistance variable element obtained in Example 3 of the present invention.

FIG. 10 is a view illustrating variations in the resistance value occurring when about 1000 times of write operation to the low-resistance state (voltage: +5.5V, pulse width: 100 ns) and write operation to the high-resistance state (voltage: +3.0V, pulse width: 1 ms) are repeatedly performed with respect to the resistance variable element obtained in Example 3. As shown in FIG. 10, it was found that the resistance variable element periodically transitions between the low-resistance state and the high-resistance state with stability even when writing is repeated 1000 times or more. Further, it was found that the resistance value of low-resistance state and the resistance value of the high-resistance state do not vary from the start (FIG. 9) to the end (FIG. 10) of the experiment. Accordingly, it was found out that the resistance variable element obtained in Example 3 has favorable endurance characteristics.

Comparative Example 1

In Comparative Example 1, a resistance variable element was manufactured and writing and reading out were carried out in manners similar to those in Example 1 to Example 3 except that different parameters were used.

To be specific, in Comparative Example 1, the voltages applied to the respective targets were adjusted so that the value of X in $TaO_X$ which forms the resistance variable layer became 1.5. The value of X was verified by the RBS (Rutherford back scattering) method. As a result of the verification, the value of X was 1.5.

Figure 11:
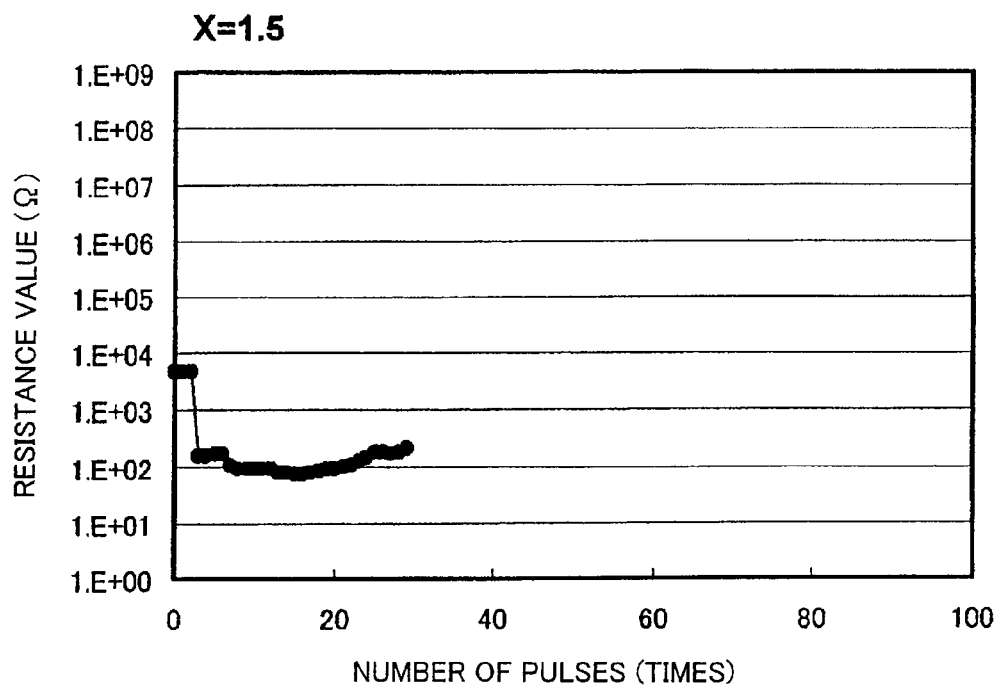
FIG. 11 is a view illustrating variations in the resistance value occurring when a voltage pulse is applied to a resistance variable element according to Comparative Example 1.

FIG. 11 is a view illustrating variations in the resistance value occurring when the voltage pulse is applied to the resistance variable element of Comparative Example 1. In FIG. 11, the resistance value does not vary at the plots of the first three pulses (number of pulses=0, 1, 2). This is because the data obtained by measuring the initial resistance value three times are plotted, and actually no pulse is applied. As shown in FIG. 11, when X was 1.5, the resistance value decreased when the voltage pulse (+4.0V, 100 ns) was applied first time (the plot at which the number of pulses is 3). However, even though the voltage pulse (+2.0V, 10 μm) was further applied, the resistance value did not return to the initial value, and no memory characteristics were shown. Furthermore, even though the magnitude and pulse width of the applied voltage pulse were significantly varied, the resistance value did not return to the initial value, and no memory characteristics were shown.

Comparative Example 2

In Comparative Example 2, a resistance variable element was manufactured and writing and reading out were carried out in manners similar to those in Example 1 to Example 3 except that different parameters were used.

To be specific, in Comparative Example 2, the voltages applied to the respective targets were adjusted so that the value of X in $TaO_X$ which forms the resistance variable layer became 2.3. The value of X was verified by the RBS (Rutherford back scattering) method. As a result of the verification, the value of X was 2.3.

Figure 12:
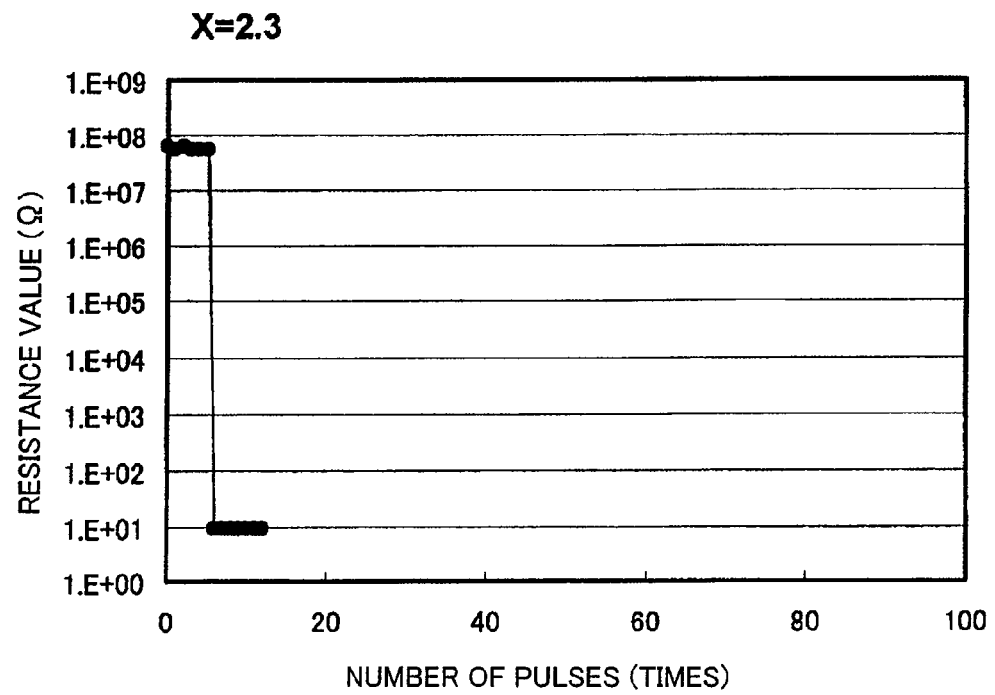
FIG. 12 is a view illustrating variations in the resistance value occurring when a voltage pulse is applied to a resistance variable element according to Comparative Example 2.

FIG. 12 is a view illustrating variations in the resistance value occurring when the voltage pulse is applied to the resistance variable element of Comparative Example 2. In FIG. 12, the resistance value does not vary at the plots of the first three pulses (number of pulses=0, 1, 2). This is because the data obtained by measuring the initial resistance value three times are plotted, and actually no pulse is applied. As shown in FIG. 12, when X was 2.3, the resistance value did not decrease by the first to third pulse applications (the plots at which the number of pulses is 3, 4, 5), but the resistance value suddenly decreased by the fourth pulse application (the plot at which the number of pulse is 6), as the voltage pulse (+5.5V, 100 ns) was applied. However, even though the voltage pulse (+3.0V, 1 ms) was further applied, the resistance value did not return to the initial value, and no memory characteristics were shown. Further, even though the magnitude and pulse width of the applied voltage pulse were significantly varied, the resistance value did not return to the initial value, and no memory characteristics were shown.

[Consideration]

From the above described examples, it was found out that a resistance variable element which can be manufactured at a lower temperature, is unipolar drivable, and does not require the "forming" can be obtained by manufacturing a resistance variable layer using a material comprising $TaO_X$ in which the value of X is adjusted to be not less than 1.6 and not more than 2.2.

Embodiment 2

In this embodiment, as an application of the resistance variable element described in Embodiment 1, configuration and operation of a resistance variable memory apparatus 100 (cross-point type memory apparatus) including the resistance variable element will be described. The cross-point type memory apparatus is a memory apparatus in which an active layer intervenes at an intersection (three-dimensional cross point) between a word line and a bit line.

[Configuration of Resistance Variable Memory Apparatus 100]

Figure 13:
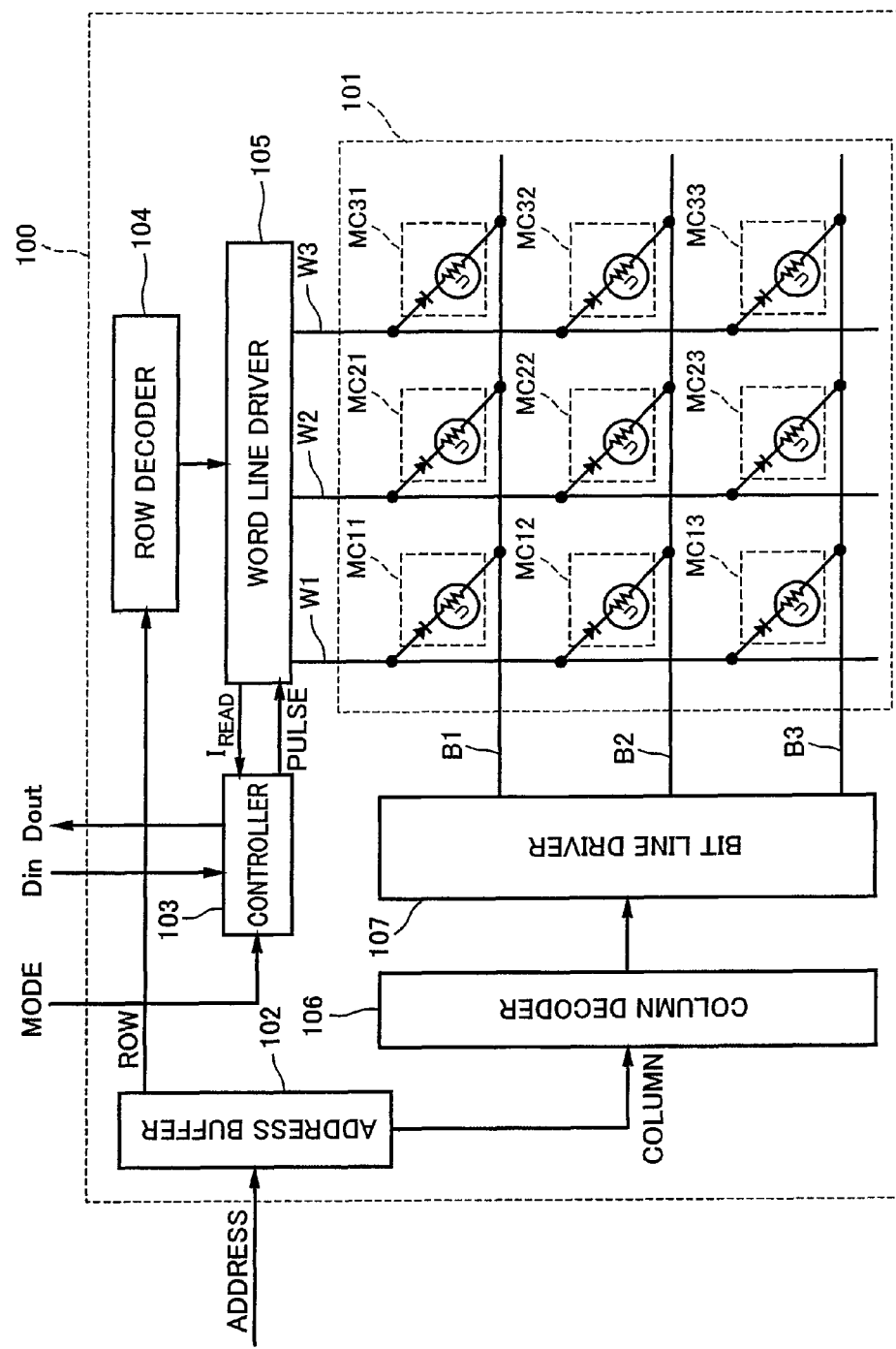
FIG. 13 is a block diagram illustrating an example of a configuration of a resistance variable memory apparatus according to Embodiment 2 of the present invention.

FIG. 13 is a block diagram illustrating an example of a configuration of a resistance variable memory apparatus according to Embodiment 2 of the present invention.

The resistance variable memory apparatus 100 comprises a memory array 101, an address buffer 102, a controller 103 (voltage pulse application unit), a row decoder 104, a word line driver 105 (word line driving unit), a column decoder 106, and a bit line driver 107 (bit line driving unit).

As shown in FIG. 13, the memory array 101 comprises a plurality of word lines W1, W2, W3, . . . (first wires) which are formed in parallel with each other so as to extend in a first direction on a semiconductor substrate, and a plurality of bit lines B1, B2, B3, . . . (second wires) which are formed above the plural word lines W1, W2, W3, . . . , in parallel with each other so as to extend in a second direction within a plane parallel to a main surface of the semiconductor substrate and so as to three-dimensionally cross the plural word lines W1, W2, W3, . . . .

Further, a plurality of memory cells MC11, MC12, MC13, MC21, MC22, MC23, MC31, MC32, MC33, . . . (hereinafter referred to as "memory cells MC11, MC12, . . . ") are provided in matrix so as to correspond to the three-dimensional cross points of the plurality of word lines W1, W2, W3, . . . and the plurality of bit lines B1, B2, B3, . . . . Each memory cell MC includes a resistance variable element 6 and a rectifier element 7 (e.g., diode) which are connected in series, and the resistance variable elements 6 are connected to the bit lines B1, B2, B3, . . . while the rectifier elements 7 are connected to the word lines W1, W2, W3, . . . . Each resistance variable element 6 is the resistance variable element of the present invention. For example, the resistance variable element 10 of Embodiment 1 can be used.

The address buffer 102 receives an address signal ADDRESS from an external circuit (not shown), and outputs a row address signal ROW and a column address signal COLUMN to the row decoder 104 and the column decoder 106, respectively, based on the address signal ADDRESS. The address signal ADDRESS is a signal indicating the address of a memory cell to be selected from among the memory cells MC11, MC12, . . . . The row address signal ROW is a signal indicating the address of a row in the address indicated by the address signal ADDRESS, and the column address signal COLUMN is a signal indicating the address of a column in the address indicated by the address signal ADDRESS.

The controller 103 selects either of a write mode (a write mode to the low-resistance state or a write mode to the high-resistance state is alternatively selected according to the value of Din) or a readout mode according to a mode selection signal MODE received from the external circuit.

In the write mode, the controller 103 outputs to the word line driver 105, a write voltage pulse to the low-resistance state or a write voltage pulse to the high-resistance state, according to the input data Din received from the external circuit.

In the readout mode, the controller 103 outputs a readout (reproduction) voltage to the word line driver 105. Further, in the readout mode, the controller 103 receives a signal $I_{READ}$ outputted from the word line driver 105, and outputs output data Dout indicating a bit value corresponding to this signal $I_{READ}$ to the external circuit. This signal $I_{READ}$ is a signal indicating a current value of a current that flows in the word lines W1, W2, W3, . . . during the readout mode.

The row decoder 104 receives the row address signal ROW outputted from the address buffer 102, and selects one of the word lines W1, W2, W3, . . . according to the row address signal ROW.

The word line driver 105 applies a voltage supplied from the controller 103, to the word line which is selected by the row decoder 104 based on the output signal of the row decoder 104.

The column decoder 106 receives the column address signal COLUMN from the address buffer 102, and selects one of the bit lines B1, B2, B3, . . . according to this column address signal COLUMN.

The bit line driver 107 grounds the bit line which is selected by the column decoder 106 based on the output signal of the column decoder 106.

In this embodiment, a first wire selection unit is constituted by the address buffer 102, the row decoder 104, and the word line driver 105. Further, a second wire selection unit is constituted by the address buffer 102, the column decoder 106, and the bit line driver 107. Further, a memory cell selection unit is constituted by the address buffer 102, the row decoder 104, the word line driver 105, the column decoder 106, and the bit line driver 107.

[Operation]

Next, a description will be given of examples of the write operation to the high-resistance state, the write operation to the low-resistance state, and the readout (reproduction) operation in the cross point type memory of this embodiment, with reference to the drawings. Since known methods can be used for selection of the bit line and the word line, application of the voltage pulse, and the like, detailed description thereof will be omitted. Hereinafter, the description will be given of a case where writing and reading out are performed with respect to the memory cell MC22.

[Write Operation to Low-Resistance State]

When writing (storing) 1-bit data expressing "1" into the memory cell MC22, the bit line B2 is grounded by the bit line driver 107, and the word line W2 is electrically connected to the controller 103 by the word line driver 105. Then, a short pulse for writing is applied to the word line W2 by the controller 103. For example, the voltage value of the short pulse is set to +4V, and the pulse width is set to 100 ns.

Through the above described operation, the short pulse is applied to the resistance variable element 6 in the memory cell MC22, and thereby the resistance variable element 6 in the memory cell MC22 turns to the low-resistance state corresponding to "1."

[Write Operation to High-Resistance State]

When writing (storing) 1-bit data expressing "0" into the memory cell MC22, the bit line B2 is grounded by the bit line driver 107, and the word line W2 is electrically connected to the controller 103 by the word line driver 105. Then, a long pulse for writing is applied to the word line W2 by the controller 103. For example, the voltage value of the long pulse is set to +2V, and the pulse width is set to 10 μs.

Through the above described operation, the long pulse is applied to the resistance variable element 6 in the memory cell MC22, and thereby the resistance variable element 6 in the memory cell MC22 turns to the high-resistance state corresponding to "0."

[Readout Operation]

When reading out the data written in the memory cell MC22, the bit line B2 is grounded by the bit line driver 107, and the word line W2 is electrically connected to the controller 103 by the word line driver 105. Then, a readout voltage is applied to the word line W2 by the controller 103. For example, the voltage value of the readout voltage is set to +0.5V. When the readout voltage is applied to the memory cell MC22, a current having a current value according to the resistance value of the resistance variable element 6 in the memory cell MC22 flows between the bit line B2 and the word line W2.

The controller 103 detects, via the word line driver 105, the magnitude of the current that flows between the bit line B2 and the word line W2, and detects the resistance state of the memory cell MC22 based on the current and the readout voltage.

It is found that the memory cell MC22 is in the state of "0" when the resistance value of the resistance variable element 6 in the memory cell MC22 is "Rb" corresponding to high resistance. It is found that the resistance variable element 6 is in the state of "1" when the resistance value of the resistance variable element 6 in the memory cell MC22 is "Ra" corresponding to low resistance.

Through the above described operation, the data written in the memory cell MC22 are read out.

[Modification 1]

While in the above description the single-layer cross-point type memory apparatus is adopted, a multilayer cross-point type memory apparatus may be configured by forming a layered structure of memory arrays. Further, the resistance variable element 6 and the rectifier element 7 may be replaced with each other. That is, the word line may be connected to the resistance variable element 6 while the bit line may be connected to the rectifier element 7. The bit line or the word line may also serve as an electrode of the resistance variable element.

While in the above description it is assumed that the resistance variable element is overwritable, if the resistance variable element is difficult to operate normally when it is overwritten, the resistance state of the resistance variable element may be read out before writing to determine whether the write pulse should be applied or not, or the resistance states of the respective resistance variable elements which are the targets of writing may be set to the initial state before writing and then writing may be performed with respect to a desired resistance variable element.

Embodiment 3

In this embodiment, as an application of the resistance variable element described in Embodiment 1, the resistance variable element is applied to a nonvolatile switching element.

As described in Example 1 and Example 3, the resistance variable element in which the value of X in $TaO_X$ as the resistance variable layer is 1.9 or 2.2 has five-digits or more variations in the resistance value due to the voltage pulse, and therefore, such resistance variable element can be utilized as a nonvolatile switching element having favorable switching characteristics.

[Effects]

As is evident from the above description, the resistance variable memory apparatus 100 of this embodiment is configured as the cross-point type memory apparatus having, in the memory cells, the resistance variable elements which can be manufactured at a low temperature and are unipolar drivable. Accordingly, high integration and large capacity can be realized with the simple configuration. Especially when it is configured as a multilayer cross-point memory apparatus, a significant increase in the memory capacity can be easily achieved.

In the resistance variable memory apparatus 100 of this embodiment, since the diodes are arranged in series with the resistance variable elements, no leakage current and no crosstalk to the adjacent resistance variable elements (memory cells) occur during the writing and reading-out process. When realizing a cross-point type memory apparatus with bipolar-operating elements, voltages and currents of different polarities must be applied to the elements which are the targets of writing in order to write data in the elements. When the polarity of the write voltage is not fixed, bidirectional diodes (e.g., varistors) must be used to avoid crosstalk. In order to appropriately operate such memory apparatus, it is necessary to appropriately set the threshold voltages and the write/readout voltages of the bidirectional diodes, which makes the design difficult. The element of this embodiment performs unipolar operation. Therefore, it is possible to easily avoid crosstalk by providing each memory cell with a unidirectional diode (a diode whose resistance value decreases only when a voltage of a certain polarity and larger than a predetermined level is applied, but does not decrease when a voltage of the opposite polarity is applied). That is, by using the element of this embodiment, the design is significantly facilitated in realizing a cross-point type memory apparatus.

Further, the resistance variable element of this embodiment may be utilized as a nonvolatile switching element having a significantly large resistance variable width and favorable switching characteristics.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

The resistance variable element and the resistance variable memory apparatus according to the present invention are useful as a novel resistance variable element which can be manufactured at a room temperature and has a property that all the voltage pulses for writing have the same polarity (unipolar drivable), and a resistance variable memory apparatus using the resistance variable element.

Further, the resistance variable element of the present invention is useful as a nonvolatile switching element having favorable switching characteristics.

The invention claimed is:
1. A resistance variable element comprising:
a first electrode;
a second electrode; and a resistance variable layer which is disposed between the first electrode and the second electrode, and electrically connected to the first electrode and the second electrode; wherein the resistance variable layer comprises a material including $TaO_X$ ($1.6 \leq X \leq 2.2$), an electric resistance between the first electrode and the second electrode is lowered by application of a first voltage pulse having a first voltage between the first electrode and the second electrode, and the electric resistance between the first electrode and the second electrode is increased by application of a second voltage pulse having a second voltage of the same polarity as the first voltage, between the first electrode and the second electrode.

2. The resistance variable element according to claim 1, wherein a pulse width of the first voltage pulse is a first pulse width, a pulse width of the second voltage pulse is a second pulse width, and the second pulse width is longer than the first pulse width.

3. The resistance variable element according to claim 1, wherein X is not less than 1.9 and not more than 2.2.

4. The resistance variable element according to claim 1, further comprising a rectifier element which is electrically connected to the first electrode or the second electrode.

5. The resistance variable element according to claim 4, wherein the rectifier element is a diode.

6. The resistance variable element according to claim 1, wherein at least one of the first electrode and the second electrode is an electrode which comprises one or plural materials selected from a group consisting of Ag, Au, Pt, Ir, TiN, TiAlN, and Cu.

7. A resistance variable memory apparatus comprising:
the resistance variable element according to claim 1; and
a voltage pulse application unit;
wherein the voltage pulse application unit is configured to apply the first voltage pulse to the resistance variable element to change the resistance variable element into a low-resistance state, and to apply the second voltage pulse to the resistance variable element to change the resistance variable element into a high-resistance state, so as to store data in accordance with the resistance state of the resistance variable element.

8. A resistance variable memory apparatus comprising:
a cross-point type memory array having the resistance variable element according to claim 1 in each of memory cells;
a memory cell selection unit which is configured to select a specified memory cell in the memory array; and
a voltage pulse application unit;
wherein the voltage pulse application unit is configured to apply the first voltage pulse or the second voltage pulse between the first electrode and the second electrode of the memory cell selected by the memory cell selection unit, so as to store data into the resistance variable element in accordance with a variation in the resistance value.

9. A resistance variable memory apparatus comprising:
a semiconductor substrate; and
a memory array including a plurality of first wires formed to extend in parallel with each other on the semiconductor substrate; a plurality of second wires formed to extend in parallel with each other and to three-dimensionally cross the plurality of first wires; and memory elements each having the resistance variable element according to claim 1 and a rectifier element which are connected in series and being disposed at respective three-dimensional cross points of the plurality of first wires and the plurality of second wires, the memory elements being two-dimensionally arranged;
a first wire selection unit which is configured to select a specified one of the first wires;
a second wire selection unit which is configured to select a specified one of the second wires; and
a voltage pulse application unit;
wherein the voltage pulse application unit is configured to apply the first voltage pulse between the first electrode and the second electrode of the memory cell which is connected to the first wire selected by the first wire selection unit and to the second wire selected by the second wire selection unit to change the resistance variable element into a low-resistance state, and to apply the second voltage pulse between the first electrode and the second electrode of the memory cell which is connected to the first wire selected by the first wire selection unit and to the second wire selected by the second wire selection unit to change the resistance variable element into a high-resistance state, so as to store data in accordance with the resistance state of the resistance variable element.

10. A nonvolatile switching element comprising:
a first electrode;
a second electrode; and
a resistance variable layer which is disposed between the first electrode and the second electrode, and electrically connected to the first electrode and the second electrode; wherein the resistance variable layer comprises a material including $TaO_X$ ($1.9 \leq X \leq 2.2$), an electric resistance between the first electrode and the second electrode is lowered by application of a first voltage pulse having a first voltage between the first electrode and the second electrode, and the electric resistance between the first electrode and the second electrode is increased by application of a second voltage pulse having a second voltage of the same polarity as the first voltage, between the first electrode and the second electrode.

* * * * *